United States Patent [19]
Sentoku et al.

[11] Patent Number: 5,432,603
[45] Date of Patent: Jul. 11, 1995

[54] OPTICAL HETERODYNE INTERFERENCE MEASURING APPARATUS AND METHOD, AND EXPOSING APPARATUS AND DEVICE MANUFACTURING METHOD USING THE SAME, IN WHICH A PHASE DIFFERENCE BETWEEN BEAT SIGNALS IS DETECTED

[75] Inventors: Koichi Sentoku, Kanagawa; Noriyuki Nose, Atsugi; Minoru Yoshii, Tokyo; Kenji Saito, Atsugi; Toshihiko Tsuji, Ayase; Takahiro Matsumoto, Atsugi, all of Japan

[73] Assignee: Canon Kabushiki Kaisha, Tokyo, Japan

[21] Appl. No.: 153,038

[22] Filed: Nov. 17, 1993

[30] Foreign Application Priority Data

Nov. 20, 1992 [JP] Japan .................................. 4-333748

[51] Int. Cl.⁶ .............................................. G01B 9/02
[52] U.S. Cl. ..................................... 356/349; 356/363; 356/351
[58] Field of Search ............... 356/349, 354, 351, 399, 356/400, 363

[56] References Cited

U.S. PATENT DOCUMENTS

| | | | |
|---|---|---|---|
| 4,353,650 | 10/1982 | Sonnargren | 356/351 |
| 4,859,066 | 8/1989 | Sonnargren | 356/363 |
| 5,000,573 | 3/1991 | Suzuki et al. | 356/349 |
| 5,028,797 | 7/1991 | Abe et al. | 250/548 |
| 5,225,892 | 7/1993 | Matsugu et al. | 356/401 |

FOREIGN PATENT DOCUMENTS

| | | |
|---|---|---|
| 62-58628 | 3/1987 | Japan . |
| 3216530 | 9/1991 | Japan ............................ 250/227.19 |

Primary Examiner—Samuel A. Turner
Assistant Examiner—Robert Kim
Attorney, Agent, or Firm—Fitzpatrick, Cella, Harper & Scinto

[57] ABSTRACT

An optical element comprised of a plurality of polarizing beam splitters is provided on the optical path of a two-frequency linearly polarized laser beam source, and the optical element divides a light beam from the two-frequency linearly polarized laser beam source into two light beams, whereafter these two light beams are incident on diffraction gratings provided on a mask and a wafer, respectively. A pair of mirrors are provided vertically above the mask, and a pair of lenses, a pair of polarizing plates and a pair of photoelectric detectors are arranged in succession in the directions of reflection of the pair of mirrors. The outputs of the two photoelectric detectors become beat signals, and the phase difference between these beat signals is measured, whereby the alignment of the mask and wafer is effected. Since the optical element is comprised of a plurality of polarizing beam splitters, leak-in light included in each light beam is reduced.

13 Claims, 14 Drawing Sheets

OPTICAL HETERODYNE INTERFERENCE MEASURING APPARATUS AND METHOD, AND EXPOSING APPARATUS AND DEVICE MANUFACTURING METHOD USING THE SAME, IN WHICH A PHASE DIFFERENCE BETWEEN BEAT SIGNALS IS DETECTED

BACKGROUND OF THE INVENTION

This invention relates to an optical heterodyne interference measuring apparatus and method used, for example, for the alignment or the like of a mask and a wafer.

In prior art exposing apparatuses for the manufacture of semiconductors, an optical heterodyne method as shown in Japanese Laid-Open Patent Application No. 62-58628 has been proposed as a method of highly accurately aligning a mask and a wafer.

Referring to FIG. 27 which shows the construction of an example of the prior art, a beam splitter is provided on the optical path of a two-frequency linearly polarized laser beam source 1, and a condensing lens 3 and a photoelectric detector 4 are successively arranged in the direction of reflection of the beam splitter 2. Also, a polarizing beam splitter 6 is provided on the optical path in the direction of transmission of the beam splitter 2 with a mirror interposed therein. A mirror 7 is provided in the direction of transmission of the polarizing beam splitter 6 and a mirror 8 is provided in the direction of reflection of the polarizing beam splitter 6 so that respective light beams may enter a transmission type diffraction grating 11 on a mask 10 disposed on the underside of a mask stage 9 and a reflection type diffraction grating 14 on a wafer 13 disposed on the upper surface of a wafer stage 12.

Further, a mirror 15 is provided vertically above the mask 10 and wafer 13, and a condensing lens 16 and a photoelectric detector 17 are arranged in the direction of reflection of the mirror 15. The outputs of the photoelectric detectors 4 and 17 are connected to a signal processing control unit 18, the output of which is in turn connected to the mask stage 9 and wafer stage 12.

A light beam emitted from the two-frequency linearly polarized laser beam source 1 is divided into two beams by the beam splitter 2, and one of the two light beams is detected by the photoelectric detector 4 through the condensing lens 3 and is input as a reference beat signal to the signal processing control unit 18. The other light beam enters the polarizing beam splitter 6 via the mirror 5, and is divided into two linearly polarized light beams having only a horizontal component or only a vertical component and slightly differing in frequency from each other. The divided two light beams enter the transmission type diffraction grating 11 at a predetermined angle of incidence via the mirrors 7 and 8, respectively. The diffracted light transmission-diffracted by the transmission type diffraction grating 11 and reflection-diffracted by the reflection type diffraction grating 14 is detected by the photoelectric detector 17 via the mirror 15 and the condensing lens 16, and is input as a diffracted light beat signal to the signal processing control unit 18. The signal processing control unit 18 detects the phase difference between the reference beat signal and the diffracted light beat signal, and drives the mask stage 9 and the wafer stage 12 so that the phase difference may become null, whereby the precise alignment of the mask 10 and wafer 13 is effected.

SUMMARY OF THE INVENTION

The above-described example of the prior art, however, suffers from a problem that when the light beam emitted from the two-frequency linearly polarized laser beam source 1 is separated into two light beams by the polarizing beam splitter 6, leak-in light is created and this leak-in light affects the accuracy of measurement.

The two light beams separated by the polarizing beam splitter 6 on the basis of the difference between the planes of polarization thereof irradiate the transmission type diffraction grating 11 on the mask 10 from left and right obliquely above it, and the diffracted lights diffracted by the transmission type diffraction grating irradiate the reflection type diffraction grating 14 on the wafer 13. These irradiating lights from left and right are as shown by the following equations:

$$u1 = A \cdot \exp i \cdot (\omega 1 \cdot t + \phi 1) \tag{1}$$

$$u2 = B \cdot \exp i \cdot (\omega 2 \cdot t + \phi 2) \tag{2}$$

Since, however, leak-in light is created in the polarizing beam splitter 6, the light beams in their respective polarized states do not correspond to a light beam having a frequency component. That is, strictly speaking, the two light beams u1 and u2 irradiating the diffraction grating are as shown by the following equations:

$$u1 = A \cdot \exp i \cdot (\omega 1 \cdot t + \phi 1) + \alpha \cdot \exp i \cdot (\omega 2 \cdot t + \phi 2) \tag{3}$$

$$u2 = B \cdot \exp i \cdot (\omega 2 \cdot t + \phi 2) + \beta \cdot \exp i \cdot (\omega 1 \cdot t + \phi 1) \tag{4}$$

In the above equations, $\alpha$ and $\beta$ are amplitudes, and the light beams u1 and u2 are applied to the diffraction gratings 11 and 14, and the resultant diffracted lights are as shown by the following equations when they are caused to interfere with each other and photoelectrically converted.

$$I = \rho \cdot \cos\{(\omega 1 - \omega 2) \cdot t + (\phi 2 - \phi 1) + \Delta \phi\} \tag{5}$$

$$\tan(\Delta \phi) = \sin(\phi m - \phi u)/\{\cos(\phi m - \phi u) + (\alpha/B + \beta/A)\}, \tag{6}$$

where $\phi m$ is a phase amount corresponding to the amount of deviation of the mask 10 from a reference position, and $\phi u$ is a phase amount corresponding to the amount of deviation of the wafer 13 from the reference position. In equation (6), $(\alpha/B + \beta/A)$ is a term created by the leak-in light in the polarizing beam splitter 6, and because of this $(\alpha/B + \beta/A)$, the amount of relative positional deviation of the mask 10 and the wafer 13 and the variation in the amount of phase corresponding thereto assumes a non-linear relation.

It is an object of the present invention to provide an optical heterodyne interference measuring apparatus and method which mitigate the error caused by leak-in light included in a light beam and make highly accurate measurement possible.

It is another object of the present invention to provide an exposing apparatus and a device manufacturing method using the above-described optical heterodyne interference measuring technique.

Other objects of the present invention will become apparent from the following detailed description of some embodiments of the invention.

DESCRIPTION OF THE PREFERRED EMBODIMENTS

The present invention will hereinafter be described in detail with respect to some embodiments thereof shown in FIGS. 1 to 26.

Figure 1:
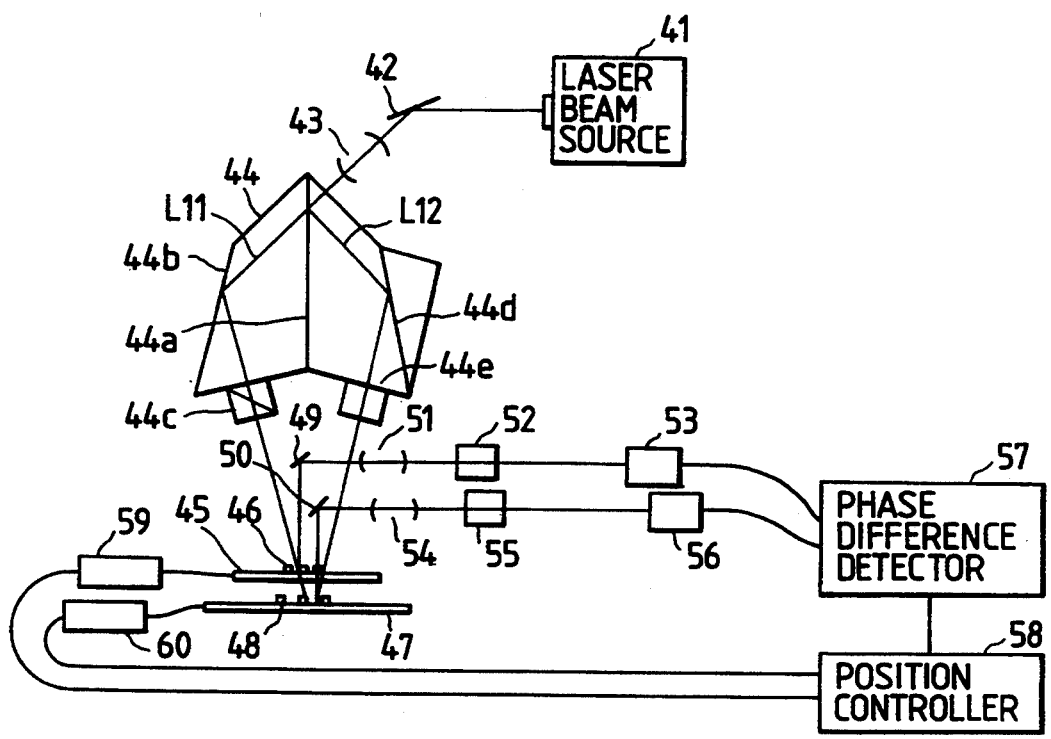
FIG. 1 shows the construction of a first embodiment of the present invention.

FIG. 1 shows the construction of a first embodiment which is applied to the aligning device unit of a semiconductor exposing apparatus. A mirror 42, a collimator lens 43 and an optical element 44 are arranged in succession on the optical path of a two-frequency linearly polarized laser beam source 41. A polarizing beam splitter surface 44a is provided on the optical path of the two-frequency linearly polarized laser beam source 41 in the optical element 44. Also, a polarizing beam splitter surface 44c is provided in the direction of transmission of the polarizing beam splitter surface 44a via a mirror 44b. Further, a polarizing beam splitter surface 44d is provided in the direction of reflection of the polarizing beam splitter surface 44a, and a dummy prism 44e is provided in the direction of reflection of the polarizing beam splitter surface 44d.

Figure 2:
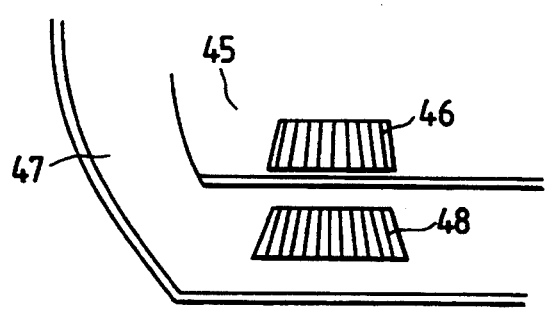
FIG. 2 shows the positional relations among a mask, a wafer and diffraction gratings.

Also, as shown in FIG. 2, a diffraction grating 46 on a mask 45 and a diffraction grating 48 on a wafer 47 are disposed in the directions of transmission of the polarizing beam splitter 44c and the dummy prism 44e. Mirrors 49 and 50 are provided vertically above the mask 45, and a lens 51, a polarizing plate 52 and a photoelectric detector 53 are arranged in succession in the direction of reflection of the mirror 49. Likewise, a lens 54, a polarizing plate 55 and a photoelectric detector 56 are arranged in succession in the direction of reflection of the mirror 50, and the outputs of the photoelectric detectors 53 and 56 are connected to a phase difference detector 57. The output of the phase difference detector 57 in turn is connected to a position controller 58, the output of which in turn is connected to actuators 59 and 60 so that the mask 45 and wafer 47 may be driven by the actuators 59 and 60, respectively.

The two-frequency linearly polarized laser beam source 41 emits a P-polarized light beam having a frequency f1 and an S-polarized light beam having a frequency f2. It is to be understood that, at this time, the two light beams are orthogonal to each other and slightly differ in frequency from each other. These two light beams are deflected by the mirror 42 and are condensed by the collimator lens 43, and thereafter enter the optical element 44. The P-polarized light beam is transmitted through the polarizing beam splitter surface 44a and is deflected by the mirror 44b, and thereafter is transmitted through the polarizing beam splitter surface 44c and becomes a P-polarized light beam L11. The S-polarized light beam is deflected by the polarizing beam splitter surfaces 44a and 44d, and thereafter is transmitted through the dummy prism 44e and becomes an S-polarized light beam L12.

At this time, the P-polarized light beam L11 is twice transmitted through the polarizing beam splitter surface and the S-polarized light beam L12 is twice reflected by the polarizing beam splitter surface, whereby leak-in light included in these light beams is reduced. The light beams L11 and L12 twice transmitted through or reflected by the polarizing beam splitter surface and emerging from the optical element 44 are as shown by the following equations:

$$u1 = A \cdot \exp\{i \cdot (\omega 1 \cdot t - \phi 1)\} + \alpha \cdot \exp\{i \cdot (\omega 2 \cdot t - \phi 2)\} \quad (7)$$

$$u2 = B \cdot \exp\{i \cdot (\omega 2 \cdot t - \phi 2)\} + \beta \cdot \exp\{i \cdot (\omega 2 \cdot t - \phi 1)\}, \quad (8)$$

where A, B, $\alpha$ and $\beta$ are amplitudes, $\omega 1$ and $\omega 2$ are angular frequencies, $\omega 1 = 2\pi \cdot f1$, $\omega 2 = 2\pi \cdot f2$, and $\phi 1$ and $\phi 2$ are initial phases. The second terms in equations (7) and (8) represent the leak-in light.

The P-polarized light beam L11 from the optical element 44 is applied to the diffraction gratings 46 and 48 so that -1st-order diffracted light may be diffracted vertically upwardly. Likewise, the S-polarized light beam L12 is applied to the diffraction gratings 46 and 48 so that +1st-order diffracted light may be diffracted vertically upwardly. Here, the signs of the diffraction order are such that with 0-order diffracted light as the center, the light beam diffracted clockwise is plus and the light beam diffracted counter-clockwise is minus.

The light beam L11 is diffracted by the diffraction gratings 46 and 48, is deflected by the mirror 49 and is condensed by the lens 51, whereafter it has its plane of polarization made uniform by the polarizing plate 52 and is detected by the photoelectric detector 53. Likewise, the light beam L12 is diffracted by the diffraction gratings 46 and 48, and has its plane of polarization made uniform by the polarizing plate 55 via the mirror 50 and lens 54, whereafter it is detected by the photoelectric detector 56. When the outputs from the photoelectric detectors 53 and 56 are converted, there are obtained beat signals I1 and I2 including the amounts of phase corresponding to the amounts of deviation of the respective diffraction gratings 46 and 48 from a reference position. The beat signal I1 and the amount of phase $\phi m$ are as shown by the following equations:

$$I1 = p1 \cdot \cos\{(\omega 2 - \omega 1) \cdot t + (\phi 2 - \phi 1) + \phi m\} \tag{9}$$

$$\tan(\phi m) = \sin(4\pi X m/P)/\{\cos(4\pi \cdot X m/P) + (\alpha/B + \beta/A)\} \tag{10}$$

Likewise, the beat signal I2 and the amount of phase $\phi u$ are as shown by the following equations:

$$I2 = p2 \cdot \cos\{(\omega 2 - \omega 1)t + (\phi 2 - \phi 1) + \phi u\} \tag{11}$$

$$\tan(\phi u) = \sin(4 \cdot Xu/P)/\{\cos(4\pi \cdot Xu/P) + (\alpha/B + \beta/A)\} \tag{12}$$

In the above equations, Xm is the amount of deviation of the diffraction grating 46 on the mask 45 from the reference position, $\phi m$ is the amount of phase corresponding to the amount of deviation Xm, Xu is the amount of deviation of the diffraction grating 48 on the wafer 47 from the reference position, and $\phi u$ is the amount of phase corresponding to the amount of deviation Xu.

When these two beat signals are input to the phase difference detector 57, there is obtained the phase difference $\Delta\phi = 2(\phi m - \phi u)$ between the two beat signals, whereby there can be found the amount of relative positional deviation between the mask 45 and the wafer 47. The non-linear error caused by the influence of the leak-in lights represented by equations (10) and (12) is mitigated by the light beams L11 and L12 being twice reflected by or transmitted through the polarizing beam splitter surface in the optical element 44. This amount of relative positional deviation is input to the position controller 58 for the mask 45 and wafer 47 and feedback is applied to the actuators 59 and 60 for the mask 45 and wafer 47, whereby the relative alignment of the mask 45 and wafer 47 can be effected highly accurately.

Figure 3:
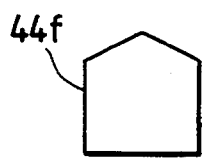
FIG. 3 is a side view of a mirror.
Figure 4:
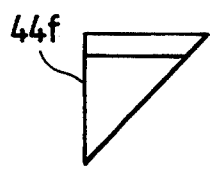
FIG. 4 is a side view of a mirror.
Figure 5:
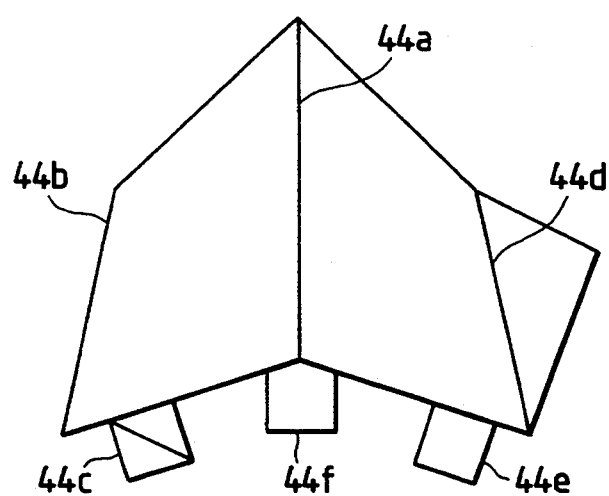
FIG. 5 shows the construction of an optical element.

The mirrors 49 and 50 in FIG. 1 may be replaced by a single mirror 44f as shown in FIGS. 3 and 4, and the mirror 44f may be attached to the optical element 44 as shown in FIG. 5.

Figure 6:
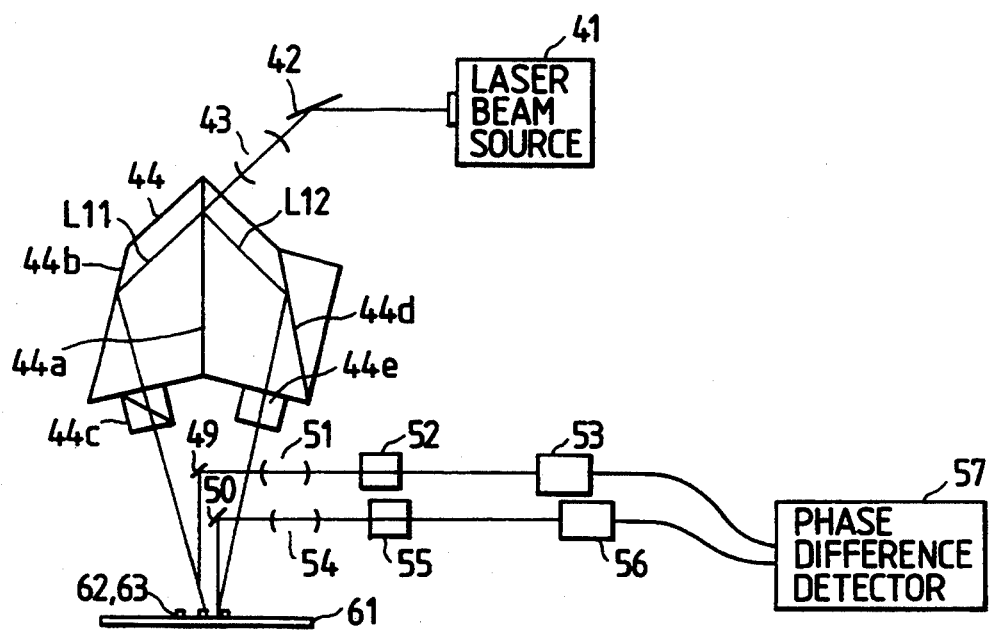
FIG. 6 shows the construction of a second embodiment of the present invention.
Figure 7:
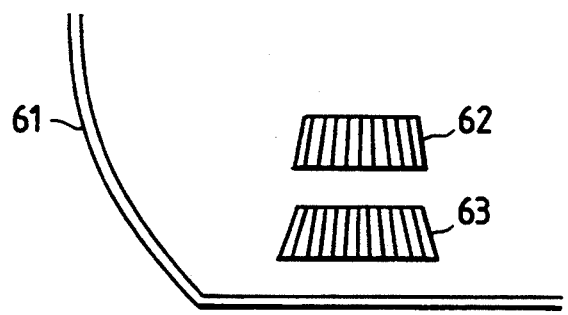
FIG. 7 shows the disposition of a wafer and a diffraction grating.

FIG. 6 shows the construction of a second embodiment of the present invention. This embodiment is an apparatus for inspecting the lapped state of circuit patterns lap-printed on a wafer. In FIG. 6, the same reference characters as those in FIG. 1 designate the same members. A wafer 61 is disposed on the respective optical paths of two light beams from the optical element 44, and diffraction gratings 62 and 63 are formed on the wafer 61. FIG. 7 shows the disposition of such a wafer 61.

The P-polarized light beam L11 from the optical element 44 is applied to the diffraction gratings 62 and 63 so that -1st-order diffracted light may be diffracted vertically upwardly. Likewise, the S-polarized light beam L12 is applied to the diffraction gratings 62 and 63 so that +1st-order diffracted light may be diffracted vertically upwardly. The light beams L11 and L12 are diffracted by the diffraction gratings 62 and 63, and as in the first embodiment, they are detected by the photoelectric detectors 53 and 56. Beat signals I3 and I4 and amounts of phase $\alpha a$ and $\alpha b$ obtain as a result are as follows:

$$I3 = p3 \cdot \cos\{(\omega 2 - \omega 1) \cdot t + (\phi 2 - \phi 1) + \phi a\} \tag{13}$$

$$\tan(\phi a) = \sin(4\pi \cdot Xa/P)/\{\cos(4\pi \cdot Xa/P) + (\alpha/B + \beta/A)\} \tag{14}$$

$$I4 = p4 \cdot \cos\{(\omega 2 - \omega 2) \cdot t + (\phi 2 - \phi 1) + \phi b\} \tag{15}$$

$$\tan(\phi b) = \sin(4\pi \cdot Xb/P)/\{\cos(4\pi \cdot Xb/P) + (\alpha/B + \beta/A)\} \tag{16}$$

In the above equations, Xa is the amount of deviation of the diffraction grating 62 on the wafer 61 from the reference position, $\phi a$ is the amount of phase corresponding to the amount of deviation Xa, Xb is the amount of deviation of the diffraction grating 63 on the wafer 61 from the reference position, and $\phi b$ is the amount of phase corresponding to the amount of deviation Xb.

When these two beat signals are input to the phase difference detector 19, the phase difference $\Delta\phi = 2(\phi b - \phi a)$ between the two beat signals is detected, and the amount of relative positional deviation between the diffraction gratings 62 and 63 on the wafer 61, i.e., the amount of relative deviation between circuit patterns, can be found highly accurately. The nonlinear error caused by the cross talk represented by equations (14) and (16) is mitigated by the light beams L11 and L12 being twice reflected by or transmitted through the polarizing beam splitter surface in the optical element 44.

Also, as in the first embodiment, in FIG. 6, the mirrors 49 and 50 for deflecting the diffracted lights from the respective diffraction gratings may be replaced by the single mirror 44f as shown in FIG. 3 and this mirror 44f may be attached to the optical element 44 as shown in FIG. 5.

Figure 8:
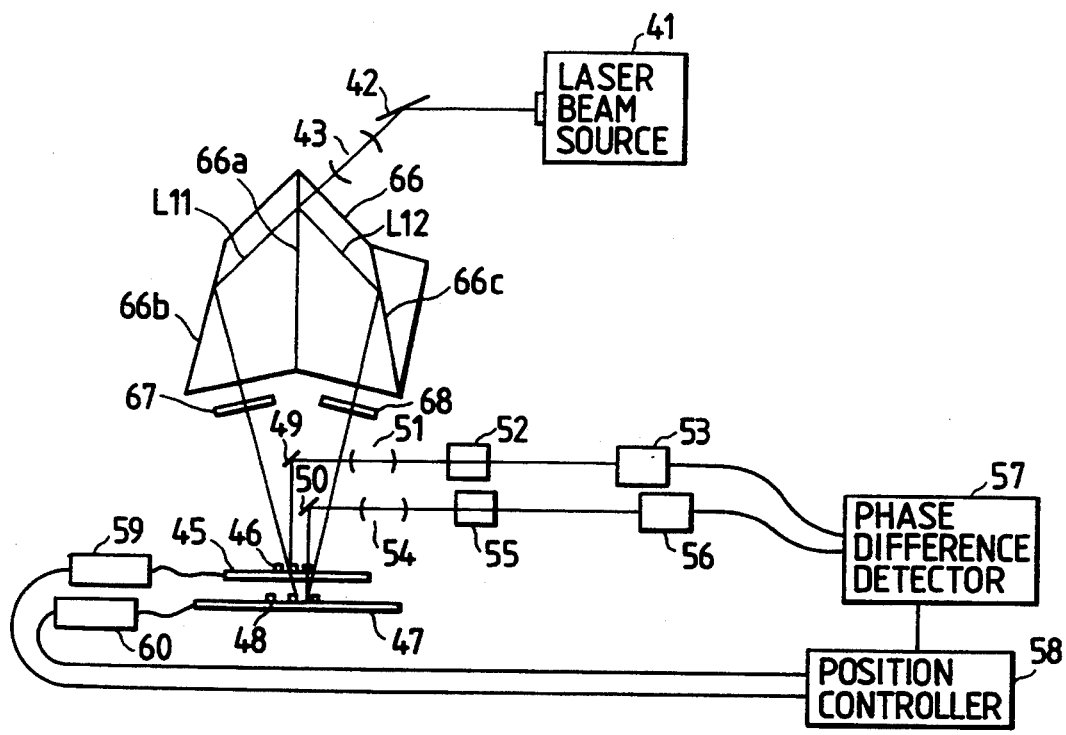
FIG. 8 shows the construction of a third embodiment of the present invention.

FIG. 8 shows the construction of a third embodiment of the present invention which is applied to a semiconductor exposing apparatus unit. An optical element 66 is provided in the direction of transmission of the collimator lens 43, and light beams L11 and L12 each are divided into two light beams by a polarizing beam splitter surface 66a provided on the optical element 66. Further, a mirror 66b is provided in the direction of transmission of the polarizing beam splitter surface 66a, and a mirror 66c is provided in the direction of reflection of the polarizing beam splitter surface 66a. Also, a polarizing plate 67 transmitting only P-polarized light therethrough is provided in the direction of reflection of the mirror 6b, and a mask 45 and a wafer 47 are disposed in the direction of transmission of the polarizing plate 67. Likewise, a polarizing plate 68 transmitting only S-polarized light therethrough is provided in the direction of reflection of the mirror 66c.

Again by such a construction, the leak-in light included in the light beams L11 and L12 can be reduced, whereafter the relative alignment of the mask 45 and wafer 47 can be effected highly accurately in accordance with a procedure similar to that in the first embodiment.

Figure 9:
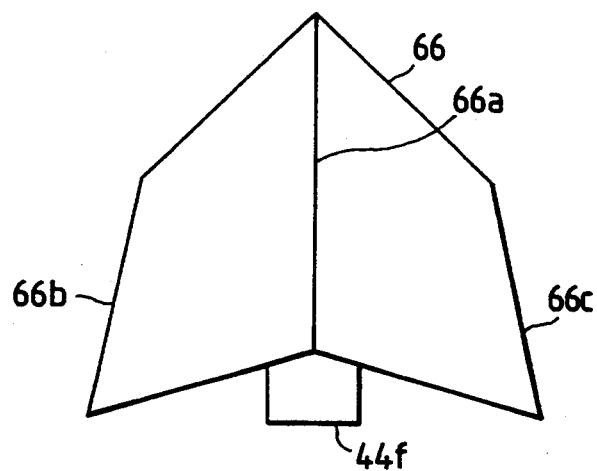
FIG. 9 shows the construction of an optical element.
Figure 10:
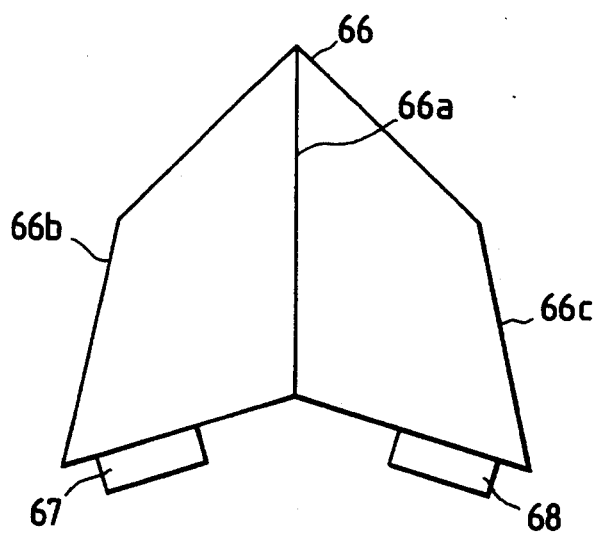
FIG. 10 shows the construction of an optical element.
Figure 11:
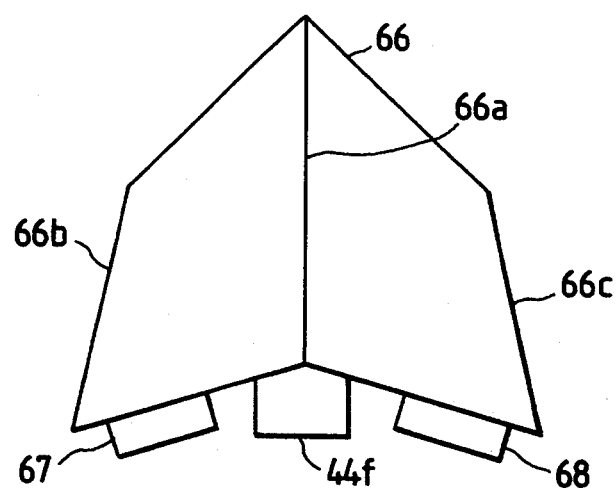
FIG. 11 shows the construction of an optical element.

Also, in FIG. 8, the mirrors 49 and 50 for deflecting the diffracted lights from the respective diffraction gratings may be replaced by the single mirror 44f shown in FIG. 3, and the mirror 44f may be attached to the optical element 66 as shown in FIG. 9. Further, the polarizing plates 67 and 68 may be attached to the optical element 66 as shown in FIGS. 10 and 11.

Figure 12:
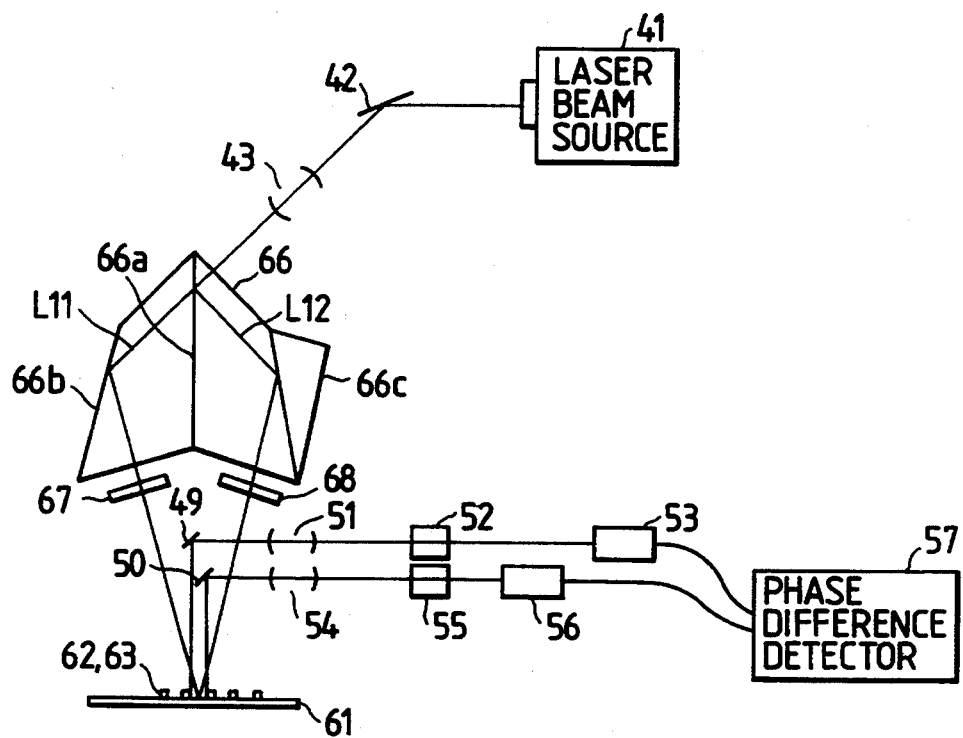
FIG. 12 shows the construction of a fourth embodiment of the present invention.

FIG. 12 shows the construction of a fourth embodiment of the present invention. In FIG. 12, the same reference characters as those in FIG. 8 designate the same members. As in the third embodiment, the light beams L11 and L12 are diffracted by diffraction gratings 62 and 63 through the polarizing plate 67 provided in the direction of transmission of the mirror 66b and the polarizing plate 68 provided in the direction of transmission of the mirror 66c, respectively, and therefore the leak-in light included in the light beams L11 and L12 can be reduced. Thereafter, the amount of relative positional deviation between the diffraction gratings 62 and 63 on the wafer 61, i.e., the amount of relative deviation between circuit patterns, can be found highly accurately in accordance with a procedure similar to that in the second embodiment.

Also, in FIG. 12, the mirrors 49 and 50 may be replaced by the single mirror 44f shown in FIG. 3, and the mirror 44f may be attached to the optical element 4 as shown in FIG. 9. Further, the polarizing plates 67 and 68 may be attached to the optical element 66 as shown in FIGS. 10 and 11, as in the third embodiment.

Figure 13:
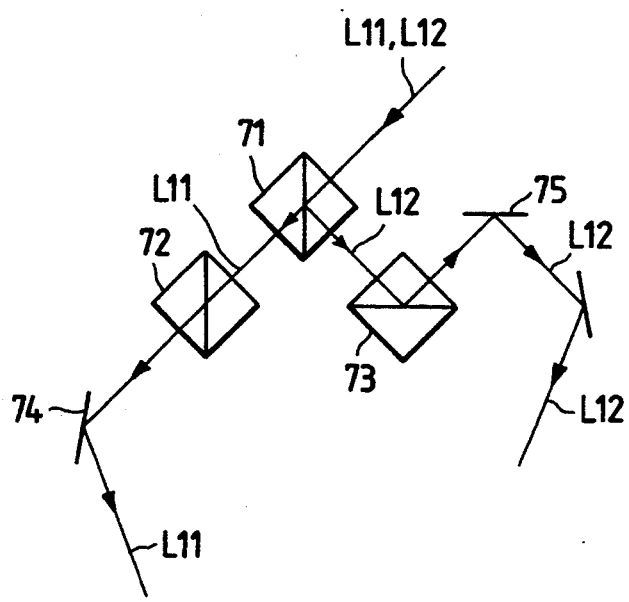
FIG. 13 shows the disposition of optical elements concerning a fifth embodiment of the present invention.

FIG. 13 shows the construction of a fifth embodiment of the present invention, and particularly shows a portion for dividing the light beam emitted from the light source into light beams L11 and L12 having their planes of polarization orthogonal to each other and slightly differing in frequency from each other. The division of the light beams L11 and L12 in the first to fourth embodiments is effected by an optical element provided by integrating some or all of the optical elements such as the polarizing beam splitter surface, the polarizing beam splitter, the mirror and the polarizing plate as shown in FIGS. 1, 5 and 9–11. In the present embodiment, as shown in FIG. 13, the optical elements may be disposed so that the light beams L11 and L12 divided into two by a polarizing beam splitter 71 may be passed through polarizing beam splitters 72 and 73 and be deflected by mirrors 74 and 75.

Figure 14:
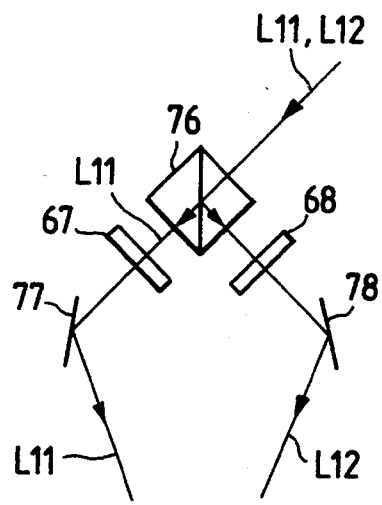
FIG. 14 shows the disposition of optical elements.
Figure 15:
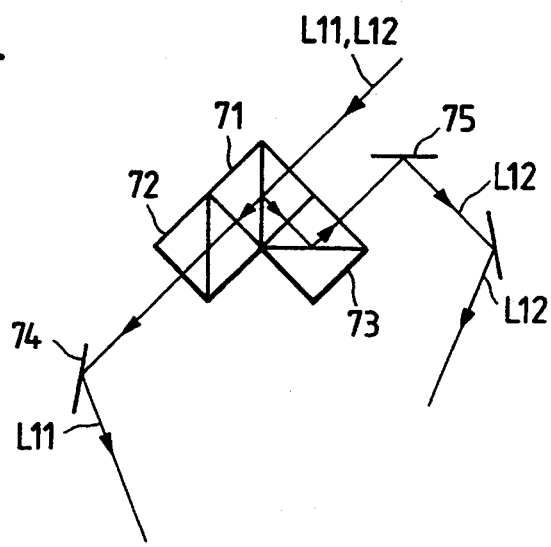
FIG. 15 shows the disposition of optical elements.
Figure 16:
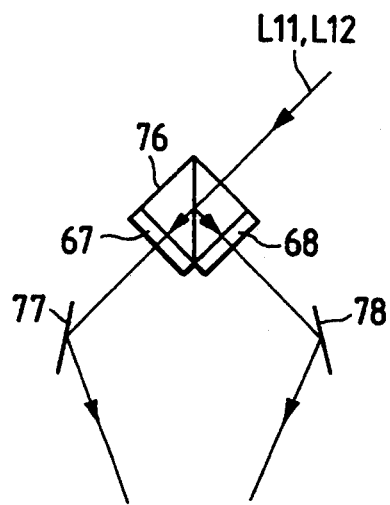
FIG. 16 shows the disposition of optical elements.

Further, also by adopting such an arrangement of the optical system as that shown in FIG. 14, the light beams L11 and L12 divided into two by a polarizing beam splitter 76 are transmitted through polarizing plates 67 and 68 and are deflected by mirrors 77 and 78, highly accurate measurement which is not affected by leak-in light becomes possible. As shown in FIG. 15, the polarizing beam splitters 71, 72 and 73 may be made integral with one another, and further as shown in FIG. 16, the polarizing beam splitter 76 and the polarizing plates 67 and 68 may be made integral with one another.

Figure 17:
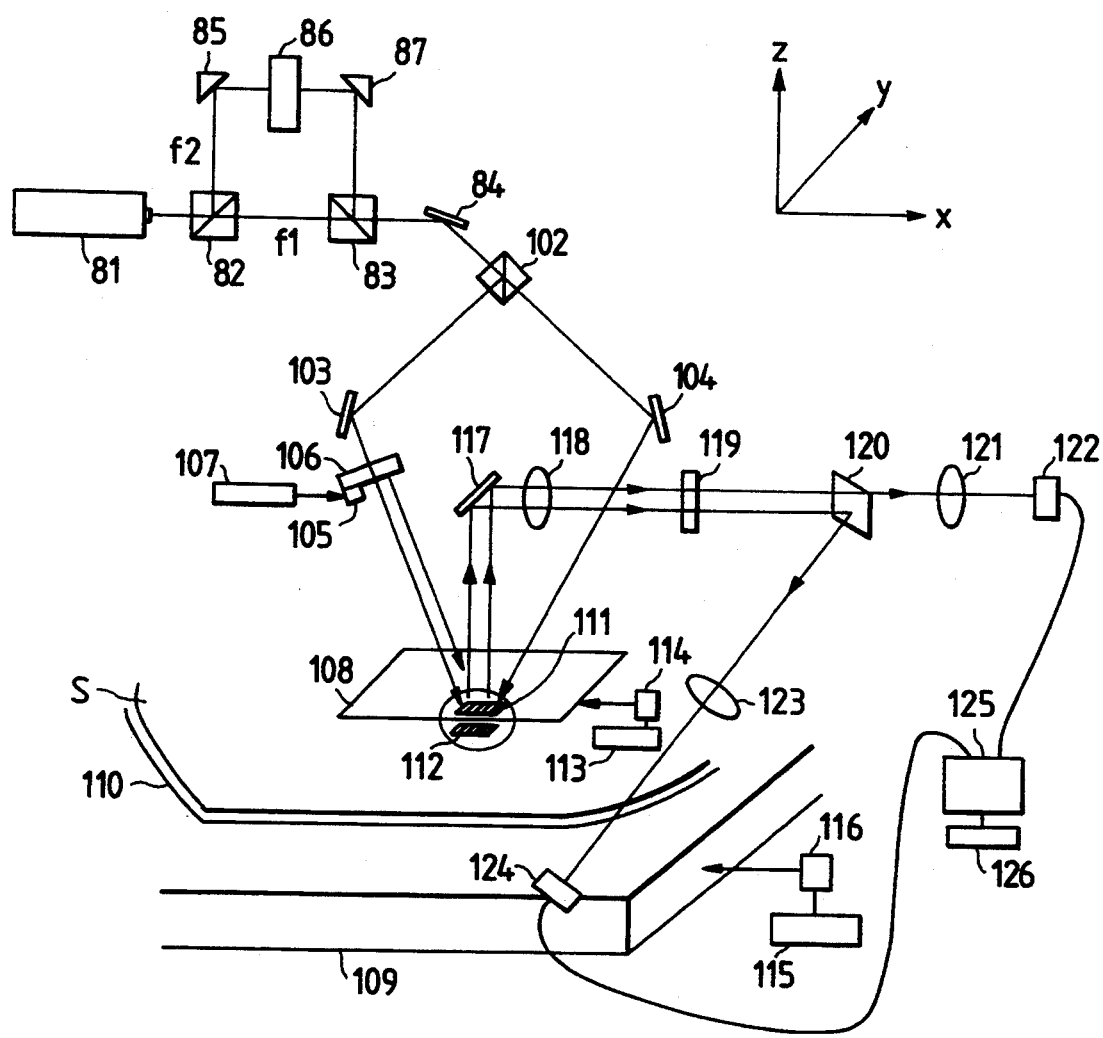
FIG. 17 shows the construction of a sixth embodiment of the present invention.

FIG. 17 shows the construction of a sixth embodiment of the present invention, and particularly shows the aligning portion of a proximity exposure type semiconductor manufacturing apparatus using far ultraviolet light, X-rays or the like which effects alignment by alignment marks formed on a mask and a wafer. Polarizing beam splitters 82 and 83 and a mirror 84 are provided on the optical path of a Zeeman laser beam source 81, and a mirror 85 is provided in the direction of reflection of the polarizing beam splitter 82. Also, phase shifting means 86 and a mirror 87 are arranged in succession in the opposite direction of the mirror 85 so that a light beam may enter the polarizing beam splitter 83 perpendicularly thereto by the reflection by the mirror 87.

Figure 18:
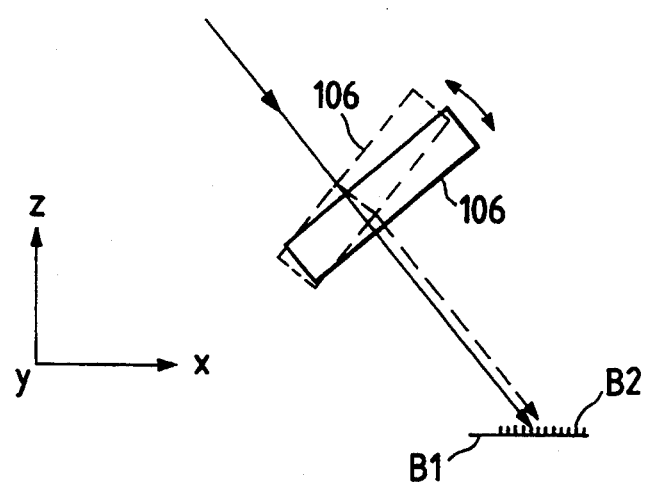
FIG. 18 illustrates phase shifting means.

Further, a polarizing beam splitter 102 is provided in the opposite direction of the mirror 84, a mirror 103 is provided in the direction of reflection of the polarizing beam splitter 102, and a mirror 104 is provided in the direction of transmission of the polarizing beam splitter 102. A plane parallel plate 106 driven by an actuator 105 is rotatably provided in the direction of reflection of the mirror 103 as shown in FIG. 18, and is connected to a driver 107. An object S to be measured is disposed in the directions of reflection of the mirrors 103 and 104 so that the light beams from the mirrors 103 and 104 may be diffracted vertically upwardly relative to the object S to be measured.

The object S to be measured is comprised of a mask 108 and a wafer 110 provided on a wafer stage 109, and alignment marks 111 and 112 are formed on the mask 108 and the wafer 110, respectively. Further, an actuator 114 connected to a driver 113 is connected to the mask 108 and an actuator 116 connected to a driver 115 is connected to the wafer stage 109 so that the mask 108 and wafer can be freely moved in the direction of the X axis. A mirror 117 is provided vertically above the object S to be measured, and a lens 118, a polarizing plate 119, an edge mirror 120, a lens 121 and a photoelectric detector 122 are arranged in succession on the optical path in the direction of reflection of the mirror 117.

Figure 19:
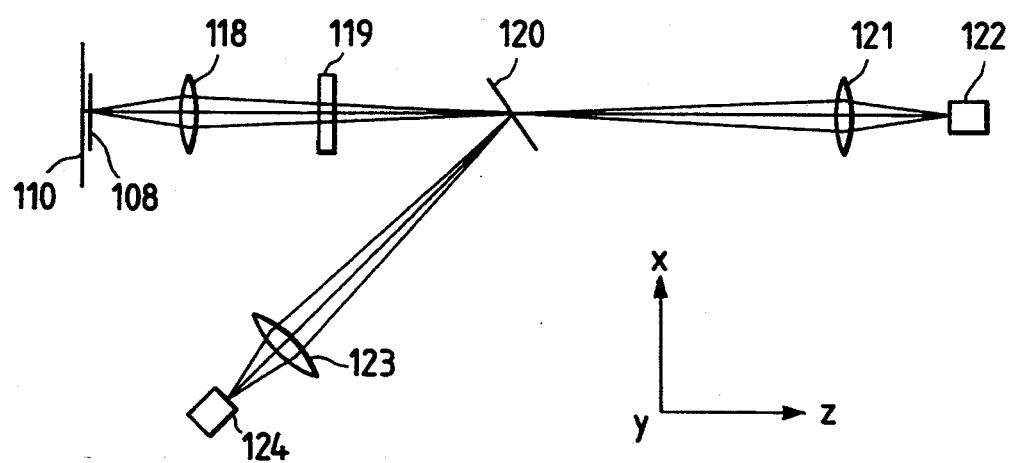
FIG. 19 illustrates separating means for diffracted light.

Each member is provided so that at this time, as shown in FIG. 19, the object S to be measured and the edge mirror 120 may be conjugate with respect to the lens 118 and that the edge mirror 120 and the photoelectric detector 122 may be conjugate with respect to the lens 121. Further, a lens 123 is provided in the direction of reflection of the edge mirror 120, and a photoelectric detector 124 is provided at a location conjugate with the edge mirror 120 with respect to the lens 123. The outputs of the photoelectric detectors 122 and 124 are connected to a phase difference detector 125, the output of which in turn is connected to a calculation processing device 126.

Polarized light beams orthogonal to each other which are emitted from the Zeeman laser beam source 81 are divided into an S-polarized light beam of frequency f1 and a P-polarized light beam of frequency f2 by the polarizing beam splitter 102. The light beam of frequency f1 is transmitted through the plane parallel plate 106 via the mirror 103 and scans a beam spot on the alignment marks 111 and 112. Also, the light beam of frequency f2 is reflected by the mirror 104, whereafter it is likewise applied to the alignment marks 111 and 112. Diffracted lights identical in the absolute value of order number and differing in the sign of order number and frequency which emerge from the alignment marks 111 and 112, respectively, for example, +1st-order light of P-polarized light and -1st-order light of S-polarized light, pass along the same optical path and are deflected by the mirror 117, and thereafter are transmitted through the lens 118 and the polarizing plate 119 for making uniform the direction of polarization.

The diffracted light from the alignment mark 11 is transmitted through the edge mirror 120 and is condensed by the lens 121, whereafter it is detected by the photoelectric detector 122, and the diffracted light from the alignment mark 112 is reflected by the edge mirror 120 and is condensed by the lens 123, whereafter it is detected by the photoelectric detector 124. The separation of the diffracted lights from the alignment marks 111 and 112 is effected in the following manner by the edge mirror 120 placed at a location conjugate with the wafer 108 with respect to the lens 118.

The alignment marks 111 and 112 are imaged at the location of the edge mirror 120, and the edge position is provided so that the edge portion of the edge mirror 120 may lie between the two alignment marks 111 and 112, whereby the diffracted light from the alignment mark 111 is transmitted through the edge mirror 120 and the diffracted light from the alignment mark 112 is reflected by the edge mirror 120 and therefore, the two diffracted lights are separated from each other. Further, the mask 108 and the wafer 110 and the photoelectric detector 122 and the photoelectric detector 124 are conjugate with each other and thus, there is provided a system which is strong for the tilt of the mask 108 and wafer 110.

In the present embodiment, phase shifting means 86 is provided between the Zeeman laser beam source 81 and the polarizing beam splitter 102 to eliminate the influence of the leak-in light of the polarizing beam splitter 102. The Zeeman laser beam source 81 emits a P-polarized light beam of frequency f1 and an S-polarized light beam of frequency f2 orthogonal to each other, and these light beams enter the polarizing beam splitter 82, and depending on their polarized states, the light beam of frequency f1 is transmitted and the light beam of frequency f2 is reflected. The reflected light beam of frequency f2 has its phase shifted by a predetermined amount by the phase shifting means 86 via the mirror 85, and enters the polarizing beam splitter 83 via the mirror 87. Also, the light beam of frequency f1 transmitted through the polarizing beam splitter 82 enters the polarizing beam splitter 83, and the two light beams of frequencies f1 and f2 pass along the same optical path and enter the polarizing beam splitter 102 via the mirror 84.

A beat signal Im detected by the photoelectric detector 122 is as follows when ±1st-order diffracted lights are used.

$$Im = Am \cdot \cos\{(\omega 1 - \omega 2) \cdot t + \Delta\phi m\} \quad (17)$$

$$\tan(\Delta\phi m) = \sin(4\pi \cdot \Delta Xm/P - \Delta\theta)/\{\cos(4\pi \cdot \Delta Xm/P - \Delta\theta) + (\alpha/B + \beta/A)\} \quad (18)$$

In the above equations, Am is the amplitude, $\alpha$ and $\beta$ are the amounts of cross talk of the polarizing beam splitter 102 to A and B, $\Delta\theta$ is the amount of phase shifted by the phase shifting means, $\Delta Xm$ is the amount of deviation of the alignment mark 111 from the reference line, and P is the pitch of the diffraction grating of the alignment mark.

Also, a beat signal Iw detected by the photoelectric detector 124 is as follows when ±1st-order diffracted lights are likewise used.

$$Iw = Aw \cdot \cos\{(\omega 1 - \omega 2) \cdot t + \Delta\phi w\} \quad (19)$$

$$\tan(\Delta\phi w) = \sin(4\pi \cdot \Delta Xw/P - \Delta\theta)/\{\cos(4\pi \cdot \Delta Xw/P - \Delta\theta) + (\alpha/B + \beta/A)\} \quad (20)$$

In the above equations, Aw is the amplitude, and $\Delta Xw$ is the amount of deviation of the alignment mark 112 from the reference line.

Figure 20:
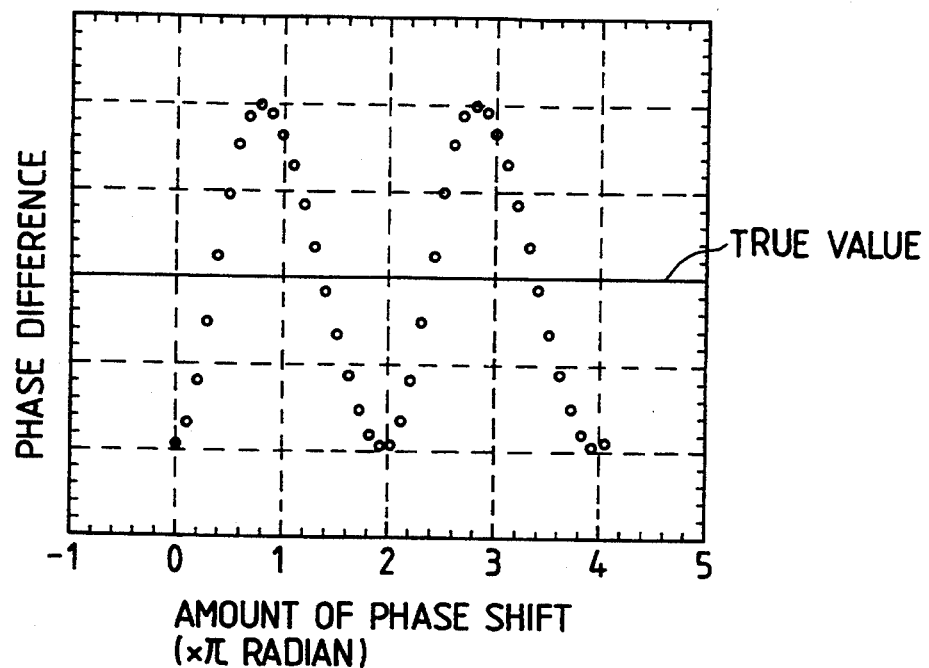
FIG. 20 is a graph showing the relation of variations in the phase difference between two beat signals with respect to the amount of phase shift.

The phase difference $\Delta\phi m - \Delta\phi w$ between the beat signals shown by equations (18) and (20) is detected by the phase difference detector 125. At this time, the phase difference $\Delta\phi m - \Delta\phi w$ relative to the amount of phase shift $\Delta\theta n$ varies in a sine-like fashion as shown in FIG. 20. Each phase difference is input to the calculation processing device 126 to effect an averaging process, whereby the deterioration of the accuracy of alignment by the influence of the leak-in light of the polarizing beam splitter 102 can be prevented and the relative positional deviation between the mask 108 and the wafer 110 can be detected highly accurately.

That is, the amount of positional deviation $\Delta X$ between the mask and the wafer can be found as follows from N times of phase difference measurement value:

$$\Delta\phi(n) = \Delta m(n) - \Delta\phi w(n) \quad (n = 1, 2, 3, \ldots, N) \quad (21)$$

$$\Delta X = (P/4\pi) \cdot (1/N) \Sigma \Delta\phi(n) \quad (22)$$

After the positional deviation is detected, the mask 108 and wafer 110 are moved by the drivers 113 and 115 on the basis of $\Delta X$ so that the amount of positional deviation may become an allowable value or less.

In the present embodiment, the X direction alone has been described, but with also regard to the alignment in the Y direction, alignment marks are provided on the mark 108 and wafer 110, respectively, in a direction orthogonal to the X direction alignment marks and an optical system is also provided in a direction orthogonal to that for X direction detection, whereby as in the X direction, the alignment of the mask 108 and wafer 110 can be effected.

Also, the integration time of the phase difference detector 125 may be set to a certain degree of a long time and the phase may be shifted several times within that integration time, and the calculation processing device 126 in this case is only required to have the function of converting the phase into the displacement of the object to be measured.

FIG. 20 is a graph showing the relation between the amount of phase shift by the phase shifting means 86 and the output of the phase difference detector 125 when the leak-in amounts of the reflection and transmission in the polarizing beam splitter 84 are both 0.1%. The measurement error when the phase shifting means 86 is absent corresponds to the amplitude in FIG. 20, but as in the present embodiment, the phases of one or both of the two light beams which are a pair of light beams forming the beat signals are shifted and the phase difference between the two beat signals is measured several times and is averaged, whereby the phase difference becomes approximate to a true amount of displacement and accuracy is improved.

Figure 21:
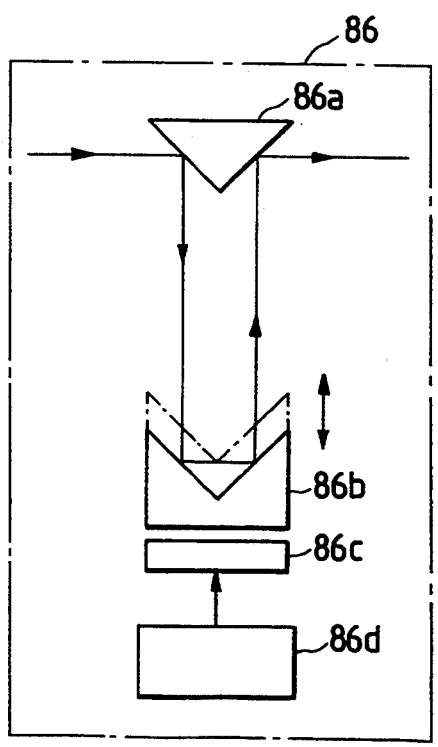
FIG. 21 shows the construction of the phase shifting means.

Referring to FIG. 21 which shows the construction of a specific example of the phase shifting means 86, a fixed triangular mirror 86a is provided on the optical path from the mirror 85, and a movable type corner cube mirror 86b is provided in the direction of reflection of the fixed triangular mirror 86a. The movable type corner cube mirror 86b has an actuator 86c and is adapted to be controlled by a driving device 86d. The movable type corner cube mirror 86b is driven by a minute amount to thereby change the length of the optical path and shift the phase.

Figure 22:
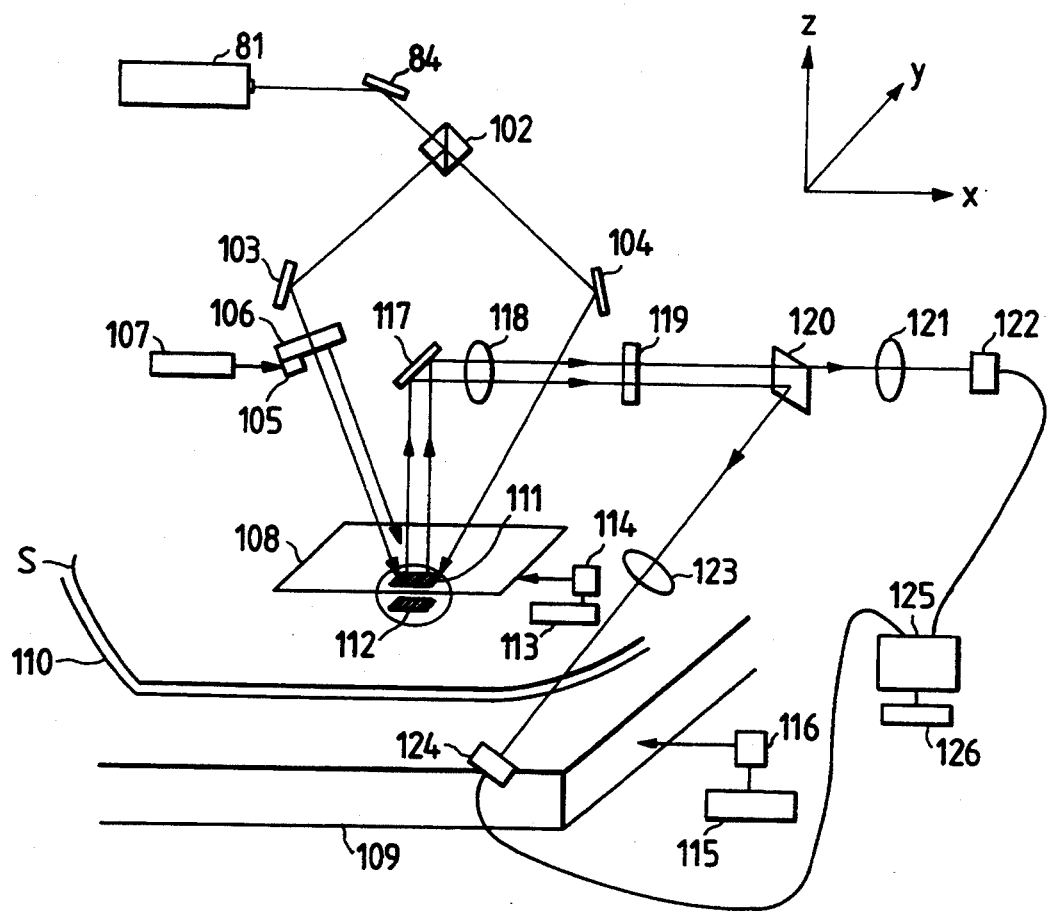
FIG. 22 shows the construction of a seventh embodiment of the present invention.

FIG. 22 shows the construction of a seventh embodiment of the present invention, and particularly shows the aligning portion of a proximity exposure type semiconductor manufacturing apparatus using far ultraviolet light, X-rays or the like which, like the sixth embodiment, effects alignment by alignment marks formed on a mask and a wafer. A mirror 84 and a polarizing beam splitter 102 are provided on the optical path of a Zeeman laser beam source 81, and a mirror 103 is provided in the direction of reflection of the polarizing beam splitter 102 and a mirror 104 is provided in the direction of transmission of the polarizing beam splitter 102. In the other points, the construction of the present embodiment is similar to that of the sixth embodiment.

Figure 23:
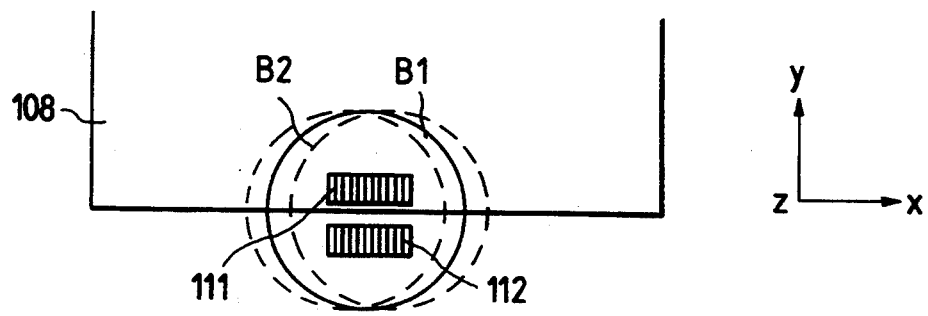
FIG. 23 illustrates the relation between an alignment mark and a beam spot.

As regards the phase shifting means for the beat signals in the present embodiment, when the plane parallel plate 106 is rotated as shown in FIG. 18, the incident beams shift in parallel directions and as shown in FIG. 23, the beam spot moves from B1 toward B2 relative to the alignment marks 111 and 112. At this time, the wave front of the light entering the alignment marks 111 and 112 varies by the amount of movement of the beam spot and therefore, the final phases of beat signals photoelectrically detected by photoelectric detectors 122 and 124 are shifted.

The beat signal Im detected by the photoelectric detector 122 is as follows when ±1st-order diffracted lights are used.

$$Im = Am \cdot \cos\{(\omega 1 - \omega 2) \cdot t + \Delta\phi m)\} \quad (23)$$

$$\tan(\Delta\phi m) = \sin(4\pi \cdot \Delta Xm/P + \Delta\theta)/\\ \{\cos(4\pi \cdot \Delta Xm/P + \Delta\theta) + (\alpha/B + \beta/A)\} \quad (24)$$

In the above equations, Am is the amplitude, $\alpha$ and $\beta$ are the amounts of cross talk of the polarizing beam splitter 102 to A and B, $\Delta\theta$ is the amount of phase shifted by the phase shifting means, $\Delta Xm$ is the amount of deviation of the alignment mark 111 from the reference line, and P is the pitch of the diffraction grating of the alignment mark.

Also, the beat signal Iw detected by the photoelectric detector 124 is as follows when ±1st-order diffracted lights are likewise used.

$$Iw = Aw - \cos\{(\omega 1 - \omega 2) \cdot t + \Delta\phi w)\} \quad (25)$$

$$\tan(\Delta\phi w) = \sin(4\pi \cdot \Delta Xw/P + \Delta\theta)/\\ \{\cos(4\pi \cdot \Delta Xw/P + \Delta\theta) + (\alpha/B + \beta/A)\} \quad (26)$$

In the above equations, Aw is the amplitude, and $\Delta Xw$ is the amount of deviation of the alignment mark 112 from the reference line.

The phase difference $\Delta\phi m - \Delta\phi w$ between the beat signals shown by equations (24) and (26) is detected by the phase difference detector 125. At this time, the phase difference $\Delta\phi m - \Delta\phi w$ relative to the amount of phase shift $\Delta\theta$ varies in a sine-like fashion as shown in FIG. 20. Each phase difference is input to the calculation processing device 126 to effect an averaging process, whereby the deterioration of the accuracy of alignment by the influence of the leak-in light of the polarizing beam splitter 102 can be prevented and the relative positional deviation between the mask 108 and the wafer 110 can be detected more highly accurately.

That is, the amount of positional deviation $\Delta X$ between the mask and the wafer can be found as follows from N times of phase difference measurement value.

$$\Delta\phi(n) = \Delta\phi m(n) - \Delta\phi w(n) \quad (n=1, 2, 3, \ldots, N) \quad (27)$$

$$\Delta X = (P/4\pi) \cdot (1/N) \Sigma \Delta\phi(n) \quad (28)$$

After the positional deviation is detected, the mask 108 and wafer 110 are moved by the drivers 113 and 115 on the basis of $\Delta X$ so that the amount of positional deviation may become an allowable value or less.

In the present embodiment, the X direction alone has been described, but with also regard to the alignment in the Y direction, alignment marks are provided on the mask 108 and wafer 110, respectively, in a direction orthogonal to the X direction alignment marks and an optical system is also provided in a direction orthogonal to that for X direction detection, whereby as in the X direction, the alignment of the mask 108 and wafer 110 can be effected.

Figure 24:
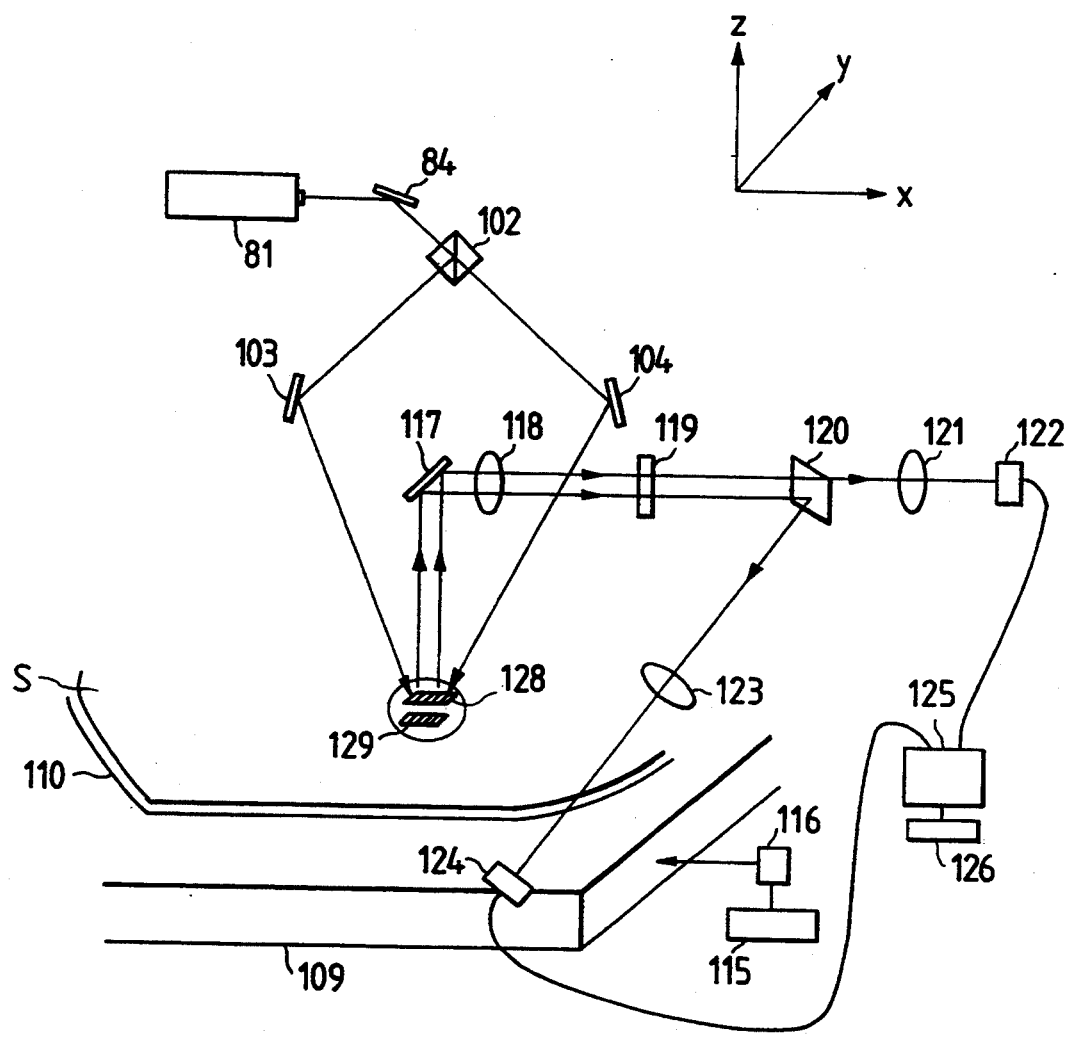
FIG. 24 shows the construction of an eighth embodiment of the present invention.

FIG. 24 shows the construction of an eighth embodiment of the present invention which is a print lap evaluating apparatus for highly accurately detecting and evaluating the positional deviation between two print lap evaluation patterns printed by two times of exposure. In FIG. 24, the same reference numerals as those in FIG. 17 designate the same members. Diffraction gratings 128 and 129 formed through discrete printing processes are provided adjacent to each other on the wafer 110. Polarized light beams orthogonal to each other which are emitted from the Zeeman laser beam source 81 are divided into an S-polarized light beam of frequency f1 and a P-polarized light beam of frequency f2 by the polarizing beam splitter 102.

The light beam of frequency f1 is applied to the diffraction gratings 128 and 129 through the mirror 103, and the light beam of frequency f2 is deflected by the mirror 104 and is likewise applied to the diffraction gratings 128 and 129. At this time, the diffracted lights from the diffraction gratings 128 and 129 pass along the same optical path and are deflected by the mirror 117, and thereafter are transmitted through the lens 118 and the polarizing plate 119. The diffracted light from the diffraction grating 128 is transmitted through the edge mirror 120, is condensed by the lens 121 and is detected by the sensor 122. Also, the diffracted light from the diffraction grating 129 is reflected by the edge mirror 120, is condensed by the lens 123 and is detected by the sensor 124. The separation of the diffracted lights from the diffraction gratings 128 and 129 is effected as in the seventh embodiment.

When the phases of beat signals are to be shifted, the wafer stage 109 is minutely moved in the deviation detecting direction by the driver 115 to thereby change the locations of the diffraction gratings 128 and 129 relative to the beam spot. At this time, the wave fronts of the lights incident on the diffraction gratings 128 and 129 vary by the same amount and thus, finally the phases of the beat signals photoelectrically detected by the photoelectric detectors 122 and 124 are shifted.

The beat signal I1 detected by the photoelectric detector 124 is as follows when ±1st-order diffracted lights are used.

$$I1 = A1 \cdot \cos\{(\omega 1 - \omega 2) \cdot t + \Delta\phi 1)\} \quad (29)$$

$$\tan(\Delta\phi 1) = \sin(4\pi \cdot \Delta X1/P + \Delta\zeta)/\\ \{\cos(4\pi \cdot \Delta X1/P + \Delta\theta) + (\alpha/B + \beta/A)\} \quad (30)$$

In the above equations, A1 is the amplitude, $\Delta\theta$ is the amount of phase shifted by the phase shifting means, ΔX1 is the amount of deviation of the diffraction grating 128 from the reference line, and P is the pitch of the diffraction gratings 128 and 129. The beat signal I2 detected by the calculation processing device 126 is as follows when ±1st-order diffracted lights are used.

$$I2 = A2 - \cos\{(\omega1 - \omega2) \cdot t + \Delta\phi2)\} \quad (31)$$

$$\tan(\Delta\phi2) = \sin(4\pi \cdot \Delta X2/P + \Delta\theta)/\{\cos(4\pi \cdot \Delta X2/P + \Delta\theta) + (\alpha/B + \beta/A)\} \quad (32)$$

In the above equations, A2 is amplitude, and ΔX2 is the amount of deviation of the diffraction grating 128 from the reference line.

The phase difference $\Delta\phi1 - \Delta\phi2$ between the beat signals shown by equations (30) and (32) is detected by the phase difference detector 125. At this time, the phase difference $\Delta\phi1 - \Delta\phi2$ relative to the amount of phase shift $\Delta\theta$ varies in a sine-like fashion as shown in FIG. 20. Each phase difference is input to the calculation processing device 126 and is averaged, whereby the problem that the phase difference becomes non-linear relative to the relative positional deviation between the two diffraction gratings 128 and 129 caused by the influence of the leak-in light of the polarizing beam splitter 102 and the accuracy of the detection of the positional deviation is deteriorated can be solved. That is, the amount of positional deviation ΔX between the diffraction gratings 128 and 129 can be found as follows from N times of phase difference measurement value.

$$\Delta\phi(n) = \Delta\phi m(n) - \Delta\phi w(n) \quad (n=1, 2, 3, \ldots, N) \quad (33)$$

$$\Delta X = (P/4\pi \times 1/N) \Sigma \Delta\phi(n) \quad (34)$$

The non-linear error is periodically varied in accordance with the movement of the wafer, and has a period of the wafer's movement P/2 when the pitch of the diffraction grating is P and ±1st-order diffracted lights are used. Therefore, a first phase difference is detected at a position, then a second phase difference is detected after movement by P/4 in the X direction, and the average value of these differences may be obtained. Thus, the non-linear error is effectively reduced without lowering of throughput.

By thus finding the amount of deviations between the pattern printed at the first time and the pattern printed at the second time, the print lap evaluation of the semiconductor exposing apparatus can be effected.

In the present embodiment, the X direction alone has been described, but the detection of the deviation in the Y direction can also be effected as in the seventh embodiment. Also, in the sixth to eighth embodiment, discrete examples of the phase shifting means have been shown, but for example, the phase shifting means shown in the sixth embodiment can be utilized also in the apparatus of the eighth embodiment, and various other combinations of the phase shifting means and the apparatus can be applied. Further, in the embodiments, there has been shown only the method of separating the light beams by the polarizing beam splitter before the light beams are applied to the object S to be measured, but a method of separating by the polarizing beam splitter the light beams after being reflected or diffracted from the object to be measured can likewise be applied.

Description will now be made of an embodiment of a method of manufacturing a device which utilizes the above-described exposing apparatus.

Figure 25:
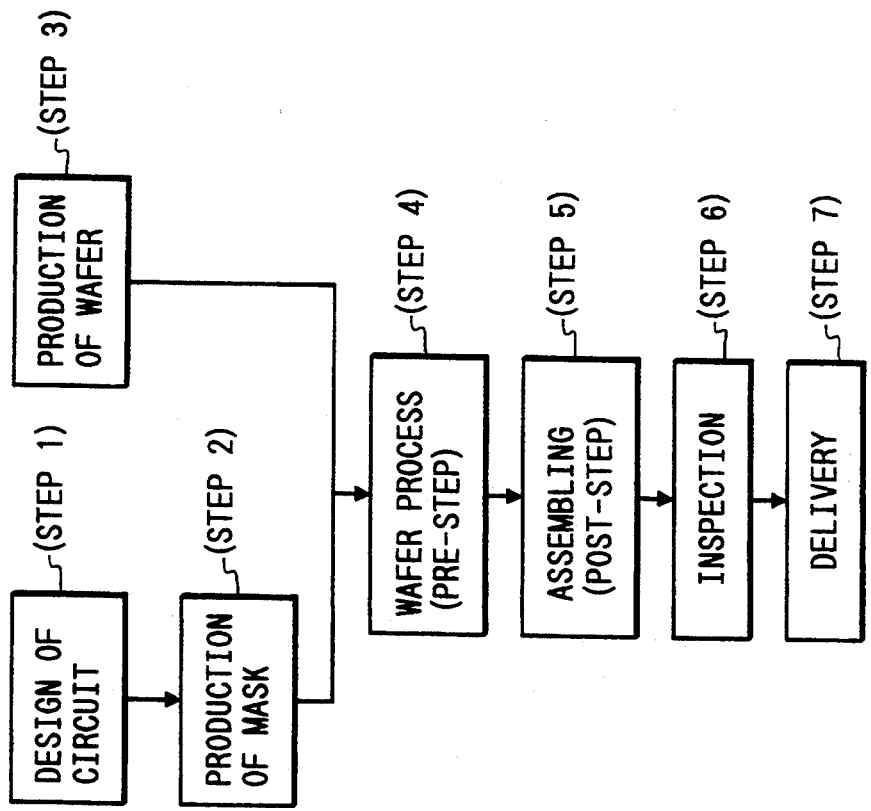
FIG. 25 is a chart showing the flow of the manufacture of a device.
Figure 27:
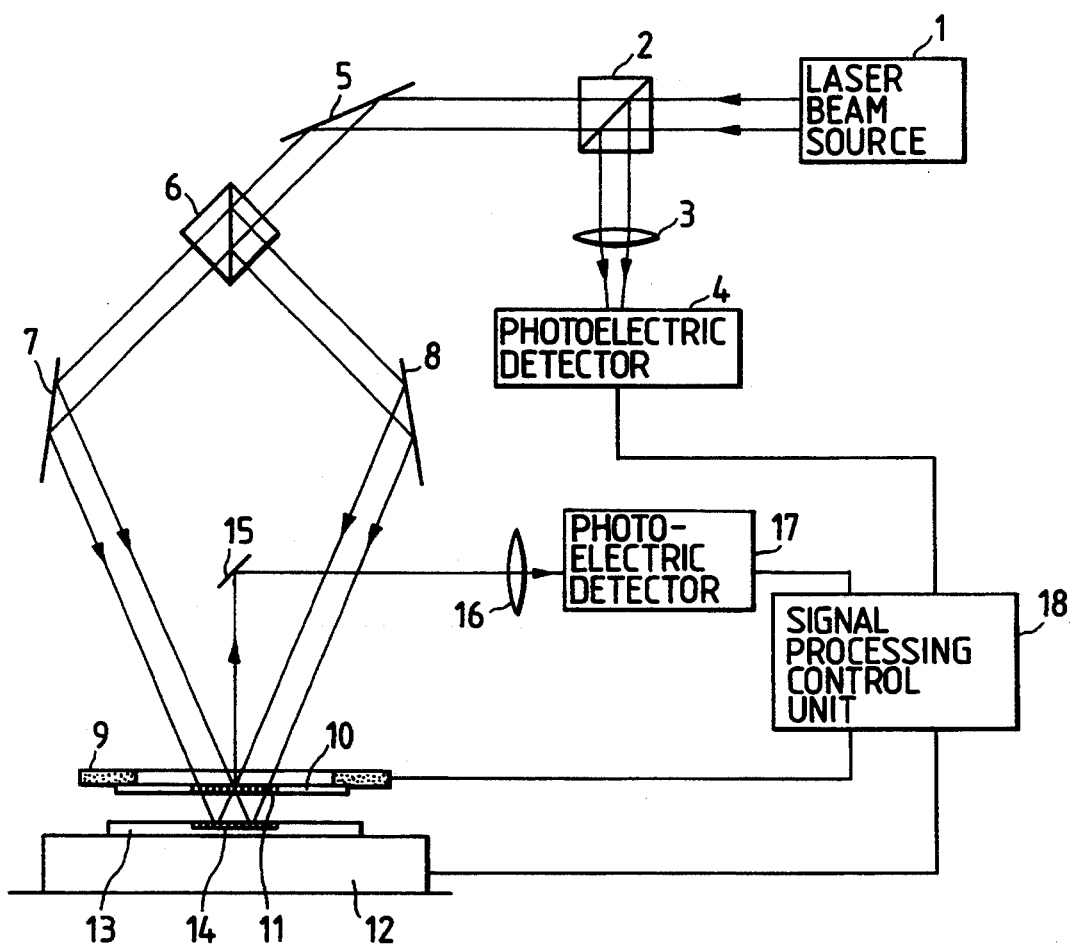
FIG. 27 shows the construction of an example of the prior art.

FIG. 25 shows the flow of the manufacture of a minute device (a semiconductor chip such as an IC or LSI, a liquid crystal panel, a CCD, a thin film magnetic head, a micromachine or the like). At a step 1 (design of circuit), the design of the circuit of a semiconductive device is effected. At a step 2 (production of mask), a mask formed with a designed circuit pattern is produced. On the other hand, at a step 3 (production of wafer), a wafer is produced by the use of a material such as silicon. A step 4 (wafer process) is called a pre-step, at which by the use of the above-mentioned prepared mask and wafer, an actual circuit is formed on the wafer by the lithography technique. The next step 5 (assembling) is called a post-step which is a step for making a semiconductor chip by the use of the wafer produced by the step 4, and includes steps such as the assembly step (dicing and bonding) and the packaging step (chip enclosing). At a step 6 (inspection), inspections such as the operation confirmation test, durability test, etc. of the semiconductive device produced at the step 5 are effected. By way of such steps, the semiconductive device is completed, and it is delivered (step 7).

Figure 26:
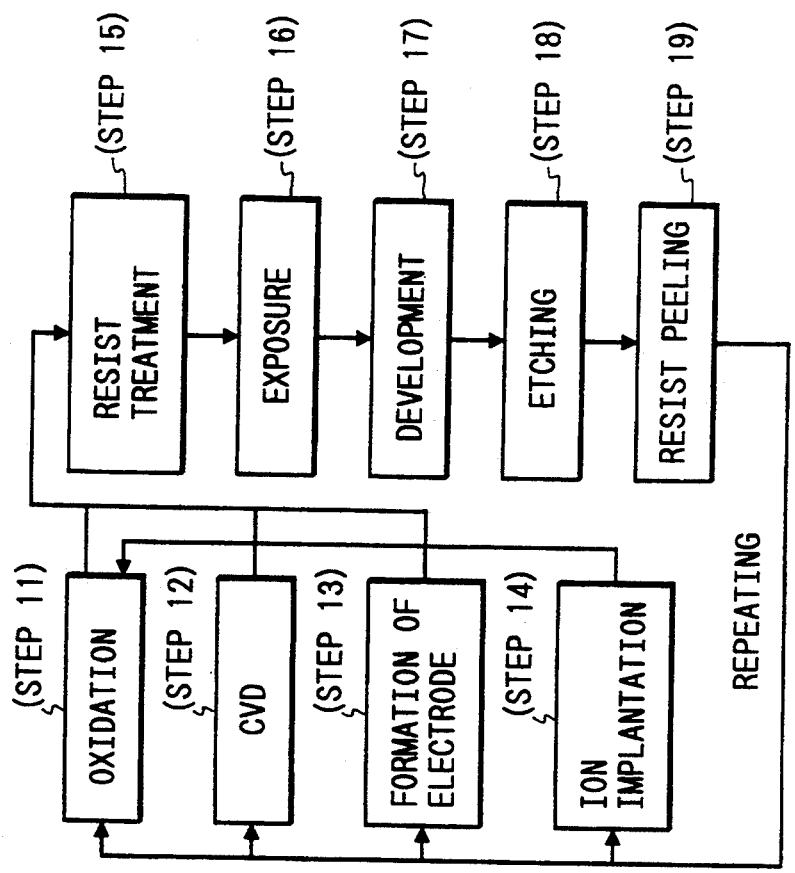
FIG. 26 is a chart showing the detailed flow of a wafer process.

FIG. 26 shows the detailed flow of the above-described wafer process. At a step 11 (oxidation), the surface of the wafer is oxidized. At a step 12 (CVD), insulating film is formed on the surface of the wafer. At a step 13 (formation of electrode), an electrode is formed on the wafer by evaporation. At a step 14 (ion implantation), ions are implanted into the wafer. At a step 15 (resist treatment), photoresist is applied to the wafer. At a step 16 (exposure), the circuit pattern of the mask is printed and exposed on the wafer by the above-described exposing apparatus. At a step 17 (development), the exposed wafer is developed. At a step 18 (etching), the portions other than the developed resist image are scraped off. At a step 19 (resist peeling), the resist which has become unnecessary after the etching is removed. By these steps being repetitively executed, multiple circuit patterns are formed on the wafer. If the manufacturing method of the present embodiment is used, it will be possible to manufacture a semiconductive device of a high degree of integration which has heretofore been difficult to manufacture.

What is claimed is:

1. An optical heterodyne interference measuring apparatus comprising:
    a light source for emitting a coherent light beam of two frequencies slightly differing from each other;
    a beam splitter for separating the light beam emitted from said light source into two light beams differing in frequency from each other;
    means for causing the two light beams to be incident on an object to be measured;
    interference means for producing first and second interference lights by the use of the light from the object to be measured;
    photoelectric detecting means for photoelectrically converting the first and second interference lights to produce first and second beat signals;
    phase difference detecting means for detecting the phase difference between the first and second beat signals; and
    optical means for mitigating light leaking in the directions of transmission and reflection of said beam splitter.

2. An optical heterodyne interference measuring apparatus according to claim 1, wherein a diffraction grating is formed on the object to be measured.

3. An optical heterodyne interference measuring apparatus according to claim 2, wherein the diffraction grating has two diffraction gratings formed on first and second substrates, respectively, disposed in opposed relationship with each other.

4. An optical heterodyne interference measuring apparatus according to claim 2, wherein said diffraction grating has two diffraction gratings formed on the same substrate.

5. An optical heterodyne interference measuring apparatus according to claim 2, wherein said interference means separates the light beam emitted from said light source into two light beams by said beam splitter and causes them to interfere with each other to thereby produce the first interference light, and causes the diffracted lights from the two diffraction gratings formed on the object to be measured to interfere with each other to thereby produce the second interference light.

6. An optical heterodyne interference measuring apparatus according to claim 1, wherein said optical means comprises a polarizing beam splitter.

7. An optical heterodyne interference measuring apparatus according to claim 1, wherein said optical means further comprises a polarizing plate.

8. An optical heterodyne interference measuring apparatus comprising:
   a light source for emitting coherent frequencies slightly differing from each other;
   a beam splitter for separating the light beam emitted from said light source into two light beams slightly differing in frequency from each other;
   means for causing the two light beams to be incident on an object to be measured;
   interference means for producing first and second interference lights by the use of the light from the object to be measured;
   photoelectric detecting means for photoelectrically converting the first and second interference lights to produce first and second beat signals;
   phase difference detecting means for detecting the phase difference between the first and second beat signals; and
   phase shifting means for shifting the phase of at least one of the two light beams.

9. An optical heterodyne interference measuring apparatus according to claim 8, wherein a diffraction grating is formed on the object to be measured.

10. An optical heterodyne interference measuring apparatus according to claim 9, wherein the diffraction grating has two diffraction gratings formed on first and second substrates, respectively, disposed in opposed relationship with each other.

11. An optical heterodyne interference measuring apparatus according to claim 9, wherein the diffraction grating has two diffraction gratings formed on the same substrate.

12. An optical heterodyne interference measuring apparatus according to claim 8, further comprising means for averaging a time-serial phase difference signal from said phase difference detecting means.

13. An optical heterodyne interference measuring apparatus according to claim 8, wherein said phase shifting means comprises means for varying the difference between the lengths of the optical paths of the first light beam and the second light beam.

* * * * *

UNITED STATES PATENT AND TRADEMARK OFFICE
CERTIFICATE OF CORRECTION

PATENT NO. : 5,432,603
DATED : July 11, 1995
INVENTOR(S) : KOICHI SENTOKU, ET AL.

It is certified that error appears in the above-indentified patent and that said Letters Patent is hereby corrected as shown below:

ON THE COVER PAGE:

Under "U.S. PATENT DOCUMENTS"

"4,353,650  10/1982  Sonnargren" should read
--4,353,650  10/1982  Sommargren-- and
"4,859,066  8/1989  Sonnargren" should read
--4,859,066  8/1989  Sommargren--.

Under "FOREIGN PATENT DOCUMENTS"

"3216530   9/1991  Japan" should read
--3-216530  9/1991  Japan-- and

Under item [30] "Foreign Application Priority Data"
The following should be inserted:

--5-280192  10/1993  Japan--.

UNITED STATES PATENT AND TRADEMARK OFFICE
CERTIFICATE OF CORRECTION

PATENT NO. : 5,432,603

DATED : July 11, 1995

INVENTOR(S) : KOICHI SENTOKU, ET AL.

It is certified that error appears in the above-indentified patent and that said Letters Patent is hereby corrected as shown below:

COLUMN 1:

Line 21, "splitter" should read --splitter 2--.

COLUMN 5:

Line 25, In equation (12), "tan($\phi u$)=sin(4·$Xu/P$)/" should read --tan($\phi u$)=sin($4\pi \cdot Xu/P$)/--.

COLUMN 6:

Line 7, "$\alpha a$ and $\alpha b$" should read --$\phi a$ and $\phi b$--; and
Line 15, In equation (15), "($\omega_2 - \omega_2$)" should read --($\omega_2 - \omega_1$)--.

COLUMN 8:

Line 65, "11" should read --111--.

COLUMN 12:

Line 64, In equation (30), "$P+\Delta\zeta)/$-" should read --$P+\Delta\theta)/$--.

UNITED STATES PATENT AND TRADEMARK OFFICE
CERTIFICATE OF CORRECTION

PATENT NO. : 5,432,603
DATED : July 11, 1995
INVENTOR(S) : KOICHI SENTOKU, ET AL.

It is certified that error appears in the above-indentified patent and that said Letters Patent is hereby corrected as shown below:

COLUMN 13:

Line 53, "embodiment," should read --embodiments,-.

COLUMN 15:

Line 4, "in" should read --in an--;
Line 7, "said" should read --the--; and
Line 27, "coherent" should read --coherent light of two--.

COLUMN 16:

Line 18, "in" should read --in an--.

Signed and Sealed this

Seventeenth Day of October, 1995

Attest:

BRUCE LEHMAN

Attesting Officer

Commissioner of Patents and Trademarks